(12) United States Patent
Neic et al.

(10) Patent No.: US 10,983,147 B2
(45) Date of Patent: Apr. 20, 2021

(54) MONITORING APPARATUS AND METHOD FOR MONITORING AN AC VOLTAGE SOURCE, WHICH IS DC-DECOUPLED FROM A REFERENCE POTENTIAL

(71) Applicant: CONTINENTAL AUTOMOTIVE GMBH, Hannover (DE)

(72) Inventors: Aurel-Vasile Neic, Kasten Bei Boeheimkirchen (AT); Emil Kovatchev, Vienna (AT)

(73) Assignee: Continental Automotive GmbH, Hannover (DE)

( * ) Notice: Subject to any disclaimer, the term of this patent is extended or adjusted under 35 U.S.C. 154(b) by 74 days.

(21) Appl. No.: 16/301,460

(22) PCT Filed: May 19, 2017

(86) PCT No.: PCT/EP2017/062178
§ 371 (c)(1),
(2) Date: Nov. 14, 2018

(87) PCT Pub. No.: WO2017/202732
PCT Pub. Date: Nov. 30, 2017

(65) Prior Publication Data
US 2019/0178914 A1    Jun. 13, 2019

(30) Foreign Application Priority Data
May 24, 2016   (DE) .................. 10 2016 208 960

(51) Int. Cl.
*G01R 15/06* (2006.01)
*G01R 31/42* (2006.01)
*G01R 27/18* (2006.01)

(52) U.S. Cl.
CPC ............. *G01R 15/06* (2013.01); *G01R 27/18* (2013.01); *G01R 31/42* (2013.01)

(58) Field of Classification Search
CPC ........ G01R 15/06; G01R 31/42; G01R 27/18; G01R 15/04; G01R 31/40; G01R 27/16
See application file for complete search history.

(56) References Cited

U.S. PATENT DOCUMENTS

| 4,896,115 A | 1/1990 | Lemaitre et al. |
| 5,760,488 A | 6/1998 | Sonntag |

(Continued)

FOREIGN PATENT DOCUMENTS

| CN | 1580795 A | 2/2005 |
| CN | 102288866 A | 12/2011 |

(Continued)

OTHER PUBLICATIONS

Wikipedia, "Smart glass". "https://en.wikipedia.org/w/index.php?title=Smart_glass&oldid=853299643", Sep. 20, 2018.

*Primary Examiner* — Lee E Rodak
(74) *Attorney, Agent, or Firm* — Laurence A. Greenberg; Werner H. Stemer; Ralph E. Locher (57) ABSTRACT

A method for monitoring an AC voltage source, which is DC-decoupled from a reference potential and which generates an AC voltage between two AC voltage lines. Each of the AC voltage lines is coupled to the reference potential by way of a respective capacitive voltage divider and a respective component voltage signal is tapped at the voltage dividers and at least one root mean square value signal is generated therefrom and a check is carried out to determine whether the respective root mean square value signal meets a predetermined triggering criterion. When the triggering criterion is met, a fault signal is generated.

13 Claims, 5 Drawing Sheets

(56) References Cited

U.S. PATENT DOCUMENTS

| | | | |
|---|---|---|---|
| 8,779,784 B2 | 7/2014 | Yang et al. | |
| 9,720,025 B2 | 8/2017 | Hermeling et al. | |
| 9,793,854 B2 | 10/2017 | Fornage et al. | |
| 10,075,129 B2 | 9/2018 | Lee | |
| 2004/0189330 A1 | 9/2004 | Herb et al. | |
| 2010/0091419 A1* | 4/2010 | Vedula | H02H 3/353 |
| | | | 361/47 |
| 2015/0168473 A1* | 6/2015 | Fornage | G01R 31/50 |
| | | | 324/509 |
| 2015/0175027 A1 | 6/2015 | Garcia-Flores | |
| 2015/0331024 A1* | 11/2015 | Bruel | G01R 21/133 |
| | | | 324/142 |
| 2017/0315159 A1* | 11/2017 | Ichikawa | G01R 15/06 |
| 2019/0146022 A1* | 5/2019 | Kinsella | G01R 31/50 |
| | | | 324/509 |

FOREIGN PATENT DOCUMENTS

| | | |
|---|---|---|
| CN | 103547932 A | 1/2014 |
| CN | 104730412 A | 6/2015 |
| CN | 105021879 A | 11/2015 |
| DE | 2943403 C2 | 12/1982 |
| EP | 2887078 A1 | 6/2015 |
| GB | 2037440 B | 7/1980 |

* cited by examiner

MONITORING APPARATUS AND METHOD FOR MONITORING AN AC VOLTAGE SOURCE, WHICH IS DC-DECOUPLED FROM A REFERENCE POTENTIAL

BACKGROUND OF THE INVENTION

Field of the Invention

The invention relates to a method for monitoring an AC voltage source, which is DC-decoupled from a reference potential and generates an AC voltage between two AC voltage lines. The invention also includes a monitoring apparatus for carrying out the method according to the invention. Finally, the invention includes an apparatus comprising said AC voltage source and the monitoring apparatus.

In an apparatus, a high AC voltage (AC—alternating current), which is preferably generated using DC/DC converters (DC voltage converters), may be required. Examples of such an apparatus are respectively a medical appliance, a hybrid drive for a motor vehicle, high-voltage automotive technology (HVEB), an electric drive or a smart-glass application; in short, everything in which a high AC voltage is used. High voltage is to be understood here as meaning a voltage having a root mean square value greater than the voltage limit specified as a high voltage, for example, in the appropriate safety standard (e.g. 24 volts, 30 volts, 60 volts, depending on the field of application).

As a specific example, a smart-glass application is intended to be dealt with here. The physical principles of smart-glass technology are available in the prior art, for example in the database Wikipedia (R) on the internet page https://en.wikipedia.org/wiki/Smart glass. Said smart glass is a special coating whose degree of optical transparency can be modulated or varied by applying an electric field. An example of the application of what is known as a smart-glass panel can be found in office buildings, trains or hotel rooms. For example, in a hotel room partition or a shower cubicle, matt or opaque smart glass can be shifted to a transparent state by applying a high AC voltage.

The high voltage can be "floating" in relation to the remaining reference potential in the appliance or device—whether it be a ground potential, a chassis of a motor vehicle, earth line or a ground plane of a circuit. This is required either due to the safety requirements or else due to the fact that the high voltage is generated using DC-isolating transformers.

The DC isolation causes two safety-relevant circuitry problems, namely the possible presence of a leakage impedance with respect to the reference potential (ground/chassis/earth) has to be detected in good time and reliably and/or the amplitude of the "floating" high voltage has to be measured in relation to the reference signal.

It should be noted that the term "leakage impedance" (and not just "leakage resistance") is used here purposefully since a possibly present capacitive component can likewise constitute a current path in AC operation.

In this connection, a further example is a smart-glass-based dimmable sunroof of a motor vehicle. Said sunroof can change its transparency, for example, by the press of a button, in order to protect the vehicle occupants from the sun's rays.

The smart-glass panels used here are actuated by applying an AC voltage (in particular of greater than 240 volts peak-to-peak, 240 Vpp), which is generated from the battery voltage by a high-voltage converter. In this case, the desire is to have available an automatic measuring and switching-off mechanism, which continuously or periodically evaluates the leakage impedance with respect to the vehicle ground (reference potential) and, where necessary, switches off the high-voltage source.

US 2004/0189330 A1 describes a "floating" DC voltage source (DC—direct current), in which a measuring circuit monitors the leakage resistance with respect to a ground potential. The measuring circuit is suitable only for DC voltage measurement, is not DC-isolated and can measure only the leakage resistance (and not the leakage impedance).

Further measuring circuits are known from U.S. Pat. No. 5,760,488 A, U.S. Ser. No. 08/779,784 B2 and U.S. Pat. No. 4,896,115 A.

SUMMARY OF THE INVENTION

The subject matter of the present notification of invention is the provision of an electrical circuit and a method in order to solve the two measuring problems listed in a cost-effective, flexible and precise manner.

The object is achieved by means of the subject matter of the independent patent claims. Advantageous developments of the invention are described by the dependent patent claims, the following description and the figures.

The invention provides a method for monitoring an AC voltage source. The method proceeds from the fact that the AC voltage source is DC-isolated or DC-decoupled from a reference potential, for example a ground potential, and generates an AC voltage between two AC voltage lines. The DC-decoupling can be effected, for example, by virtue of a secondary coil of a transformer being provided as the AC voltage source. The two terminal connections of the secondary coil can be electrically connected to each of the AC voltage lines, between which the AC voltage of the AC voltage source is then generated. A relative potential, that is to say a voltage, between each of the AC voltage lines on the one hand and the reference potential on the other hand is not defined on account of the DC-decoupling, that is to say the electrical isolation.

The method now makes provision for each of the AC voltage lines to be coupled to the reference potential by means of a respective capacitive voltage divider. The AC voltage lines thus continue to remain DC-decoupled from the reference potential. The voltage applied between the respective AC voltage line on the one hand and the reference potential on the other hand is divided in a known manner by each voltage divider. This produces a component voltage at the respective voltage divider. According to the method, a respective component voltage signal is accordingly tapped at the voltage dividers. At least one root mean square value signal is generated from the component voltage signals. For example, such a root mean square value signal can be generated by virtue of the component voltage signals being added and then a root mean square value signal being identified from this summation signal. A further possibility consists in identifying a difference between the component voltage signals and generating a root mean square value signal from said difference signal. In the method, a check is also carried out to determine whether the respective root mean square value signal meets a predetermined triggering criterion. When the triggering criterion is met, a fault signal is generated. For example, there can then be provision for the AC voltage source to be switched off depending on the fault signal.

The method according to the invention produces the advantage that it is possible to monitor the AC voltage source to determine whether the AC voltage source is interconnected or coupled in a faulty manner in relation to the reference potential. This is signaled by the fault signal. It is then possible to perform, for example, an emergency switch-off of the AC voltage source in the described manner. The monitoring comprises in this case not only the AC voltage source alone but preferably also the AC voltage lines. In other words, the circuit arrangement composed of the AC voltage source and the AC voltage lines is monitored.

The respective root mean square value signal can be formed, for example, on the basis of an analog circuit or by means of a digital signal processing unit, for example a microcontroller. Another name for root mean square value is also RMS value (square root of the identified square of the signal values). In order to stipulate a time base for the averaging, for example, a moving average value or moving average of the squared signal can be provided, for example by means of convolution using a rectangular function. It is also possible to provide recursive averaging, for example by convolution using an exponential function.

The invention also includes advantageous refinements, the features of which yield additional advantages.

When a summation root mean square value signal is generated from a sum of the component voltage signals in the described manner, the advantage that said summation root mean square value signal indicates the root mean square value of the AC voltage generated between the AC voltage lines by the AC voltage source is produced. It is thus possible to measure or identify the AC voltage of the AC voltage source in the case of DC isolation.

In this case, for example, as triggering criterion, it is possible to check whether a signal value of the summation root mean square value signal is located outside of a predetermined value interval, which describes rated voltage values of the AC voltage. It is thus possible to check whether or not the AC voltage source generates the prescribed AC voltage.

If a difference between the component voltage signals is generated in the described manner, this produces a delta root mean square value signal after the formation of the root mean square value. The component voltage signals are thus subtracted from one another and a root mean square value signal is formed from said difference signal. As triggering criterion, it is possible to check, on the basis of the delta root mean square value signal, whether a signal value of the delta root mean square value signal is located in a predetermined value interval. For example, it is possible to check whether the signal value is greater than or lower than a predetermined threshold value. The delta root mean square value signal has the advantage that the signal value thereof is dependent on a leakage impedance, which is effective between the AC voltage lines on the one hand and the reference potential on the other hand.

In order to estimate or to identify said impedance value of the leakage impedance, there is provision, in particular, for the signal value of the delta root mean square value signal to be scaled using a gain factor so that the impedance value of the leakage impedance, which is effective between the AC voltage lines and the reference potential, is identified. As a result of this, provision is then made of an absolute impedance value, which can be compared with a prescribed minimum value, as can be stipulated by a safety standard, for example.

Accordingly, as triggering criterion, a check is preferably carried out to determine whether the impedance value is lower than a predetermined triggering value. In this case, the AC voltage source can then be switched off, for example.

The described gain factor is dependent on the circuit arrangement comprising the AC voltage source and the AC voltage lines. Calibration is therefore preferred. In other words, the gain factor is identified by means of said calibration. Here, the calibration preferably comprises the following steps: while a predetermined calibration impedance couples the AC voltage lines to the reference potential, a signal value of the delta root mean square value signal is identified. Said calibration impedance can be provided as an electrical component part and/or as an electrical circuit. For example, a parallel circuit composed of an electrical resistor and an electrical capacitor can be provided. The described signal value can be a single value of the delta root mean square value signal. The signal value can also be formed, for example, as an average value of a plurality of measurements. This makes the calibration more robust. If the signal value is denoted as rms(Vd), that is to say as an RMS value of the difference signal Vd of the component voltage signals, and, in the case of the calibration impedance, the impedance value thereof is denoted as $Z_{cal}$, the gain factor K is calculated as K(Zcal)=Zcal*rms(Vd).

The calibration preferably also comprises a direct current test or DC test. To this end, a check is carried out before and/or after the identification of the signal value of the delta root mean square value signal rms(Vd) to determine whether a direct current is flowing between at least one of the AC voltage lines and the reference potential. In the case of a direct current flowing, the calibration is terminated. This ensures that the calibration is carried out only when the DC isolation is intact. Otherwise, a leakage current cannot be detected reliably on the basis of the gain factor.

In addition or as an alternative thereto, the calibration preferably comprises, before and after the identification of the signal value of the delta root mean square value signal rms(Vd), a root mean square voltage value of the AC voltage of the AC voltage source also being identified in each case. This can be effected in the described manner on the basis of the summation root mean square value signal rms(Vs). The calibration is terminated if a difference between the two root mean square voltage values is greater than a predetermined tolerance value. The summation signal must permanently be the same, which signals that the AC voltage source functions properly, that is to say as intended. The described root mean square value of the AC voltage can be based on a single measurement value or, for example, on an average value from a plurality of measurement values.

In order to carry out the method according to the invention, the invention provides a monitoring apparatus for monitoring an AC voltage source, which is DC-decoupled or DC-isolated from a reference potential. The AC voltage source is configured, in the described manner, to generate an AC voltage between two AC voltage lines.

To this end, the monitoring apparatus has, in the described manner, a respective capacitive voltage divider for each of the AC voltage lines for the capacitive coupling of the AC voltage lines to the reference potential. Furthermore, a measuring circuit is provided, which is configured to detect component voltage signals at the voltage dividers. The monitoring apparatus is configured to carry out an embodiment of the method according to the invention. To this end, the monitoring apparatus can comprise an analog circuit part and optionally a digital circuit part.

The invention finally relates to the entire apparatus having the AC voltage source, which is DC-decoupled or DC-isolated from the reference potential and which is configured to generate an AC voltage between two AC voltage lines, and having the monitoring apparatus, which constitutes an embodiment of the monitoring apparatus according to the invention and which is coupled to the AC voltage lines and to the reference potential.

Said apparatus is designed, in particular, as a smart-glass panel or smart-glass window arrangement or as a high-voltage on-board power supply system of a motor vehicle or as a hybrid drive of a motor vehicle or as a medical appliance.

BRIEF DESCRIPTION OF THE SEVERAL VIEWS OF THE DRAWING

An exemplary embodiment of the invention is described below. In this regard, in the figures.

DESCRIPTION OF THE INVENTION

The exemplary embodiment explained below is a preferred embodiment of the invention. In the exemplary embodiment, the described components of the embodiment each represent individual features of the invention which are to be considered independently of one another and which each also develop the invention independently of one another and can therefore also be considered to be a component of the invention, either individually or in a combination other than that shown. Furthermore, further features of the invention which have already been described can also be added to the described embodiment.

In the figures, functionally identical elements are in each case provided with the same reference designations.

Figure 1:
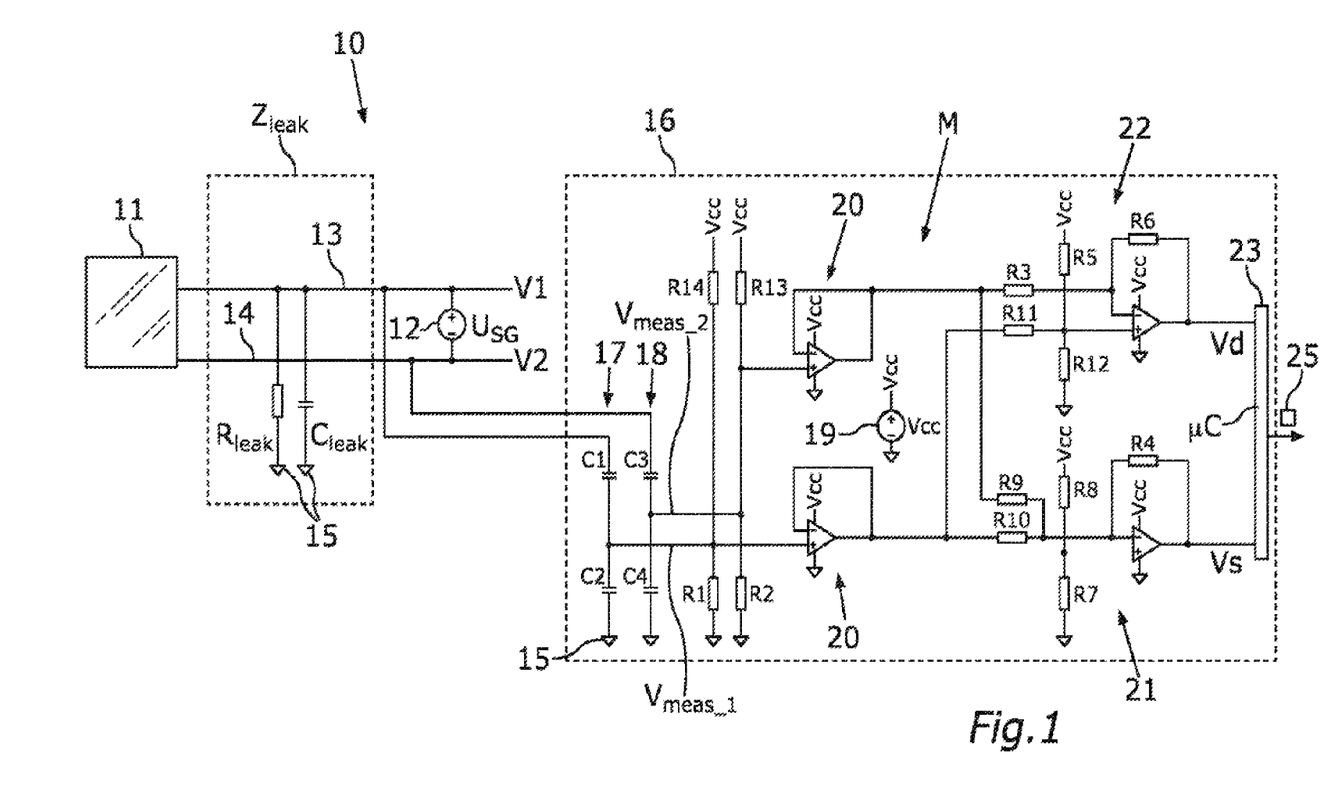
FIG. 1 shows a schematic illustration of an embodiment of the apparatus according to the invention.

FIG. 1 shows an apparatus 10, in which said apparatus can be, for example, a smart-glass window arrangement. The apparatus 10 can be integrated in a motor vehicle, for example. The apparatus 10 can have a smart-glass panel 11, the transparency of which is prescribed by means of an AC voltage $U_{SG}$ or is set in a closed control loop even in multiple stages or without stages. The transparency of the smart glass can therefore also be set without stages or the transparency can be controlled. The AC voltage $U_{SG}$ is generated by an AC voltage source 12, which can be coupled to the panel 11 by means of 2 AC voltage lines 13, 14. The AC voltage $U_{SG}$ can have, for example, a root mean square value or a peak-to-peak value (Vpp) or more than 60 volts.

The AC voltage source 12 and the AC voltage lines 13, 14 are electrically isolated or DC-decoupled from a reference potential 15 if the apparatus 10 is functioning as intended, that is to say has a predetermined setpoint state. As a result of this, each of the AC voltage lines 13, 14 has a voltage V1, V2 with respect to the reference potential 15, which is not fixed, that is to say can change freely during operation. The reference potential 15 can be, for example, a ground potential, such as can be fixed in a motor vehicle by way of the bodywork or design thereof, for example.

In the event of a fault, a leakage impedance $Z_{leak}$ can be effective between the AC voltage lines 13, 14 one the one hand and the reference potential 15 on the other hand. In order to recognize or to detect this, a monitoring apparatus 16 is provided in the apparatus 10. The monitoring apparatus 16 illustrated in FIG. 1 is only an exemplary embodiment.

The monitoring apparatus 16 can have a capacitive voltage divider 17, by means of which the AC voltage line 13 can be coupled to the reference potential 15. Furthermore, a capacitive voltage divider 18 can be provided, by means of which the AC voltage line 14 can be coupled to the reference potential 15. The leakage impedance $Z_{leak}$ can have a conductive portion as leakage resistance $R_{leak}$ and a capacitive portion as leakage capacitance $C_{leak}$.

A measurement voltage can be tapped at each of the capacitive voltage dividers 17, 18, as a result of which two component measurement signals $V_{meas\_1}$, $V_{meas\_2}$ (meas—measurement) are available. The component voltage signals $V_{meas\_1}$, $V_{meas\_2}$ are tapped between two series-connected capacitors C1, C2 and C3, C4, respectively, of the respective voltage divider 17, 18.

The monitoring apparatus 16 can have a supply voltage source 19 for generating a supply voltage Vcc. Two voltage followers or buffers 20 of a measuring circuit M can cause decoupling of the voltage dividers 17, 18 from a remaining part of a measuring circuit M.

The monitoring apparatus 16 can have, as a further part of the measuring circuit M, a summing unit 21 for forming a summation signal or, in short, a sum Vs from the component voltage signals $V_{meas\_1}$, $V_{meas\_2}$. Furthermore, a subtraction unit 22 can be provided, by means of which a difference signal or, in short, a difference Vd can be formed from the component voltage signals $V_{meas\_1}$, $V_{meas\_2}$.

Figure 5:
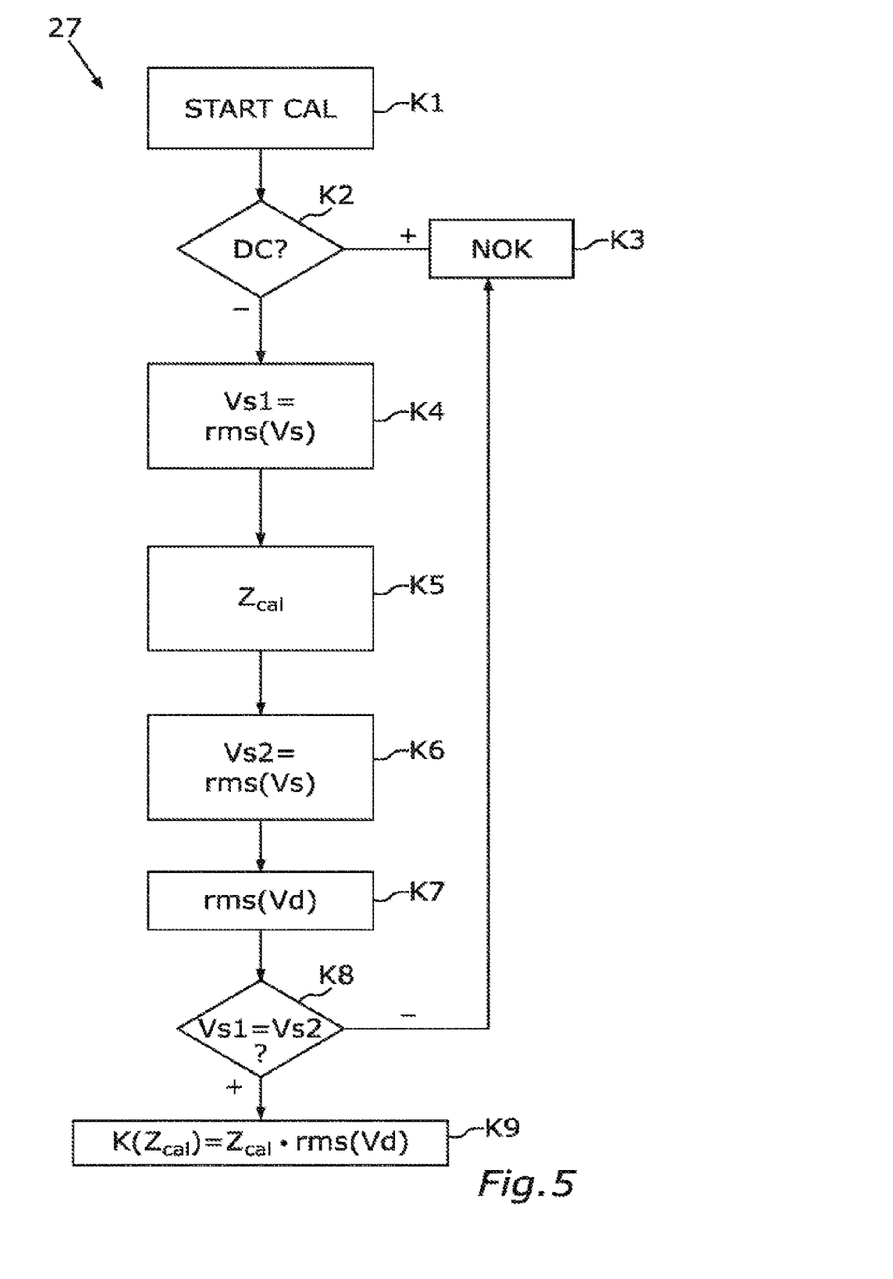
FIG. 5 shows a flowchart to illustrate calibration for the monitoring apparatus.
Figure 6:
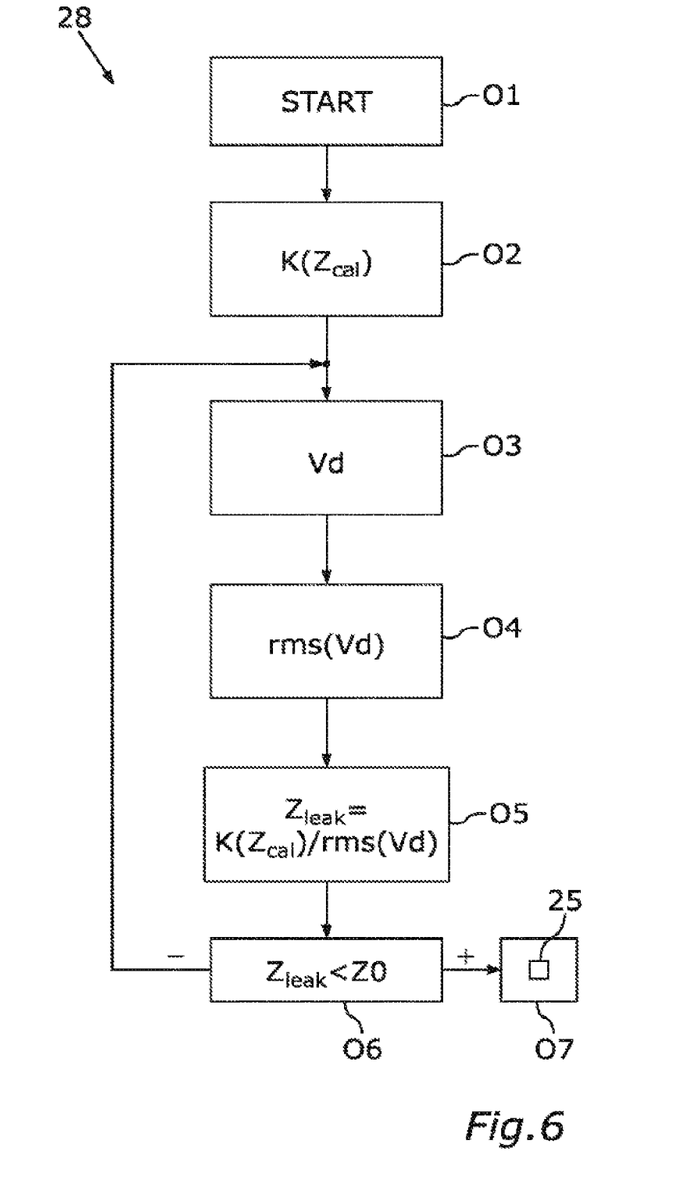
FIG. 6 shows a flowchart to illustrate a method that can be carried out by a monitoring apparatus of the apparatus of FIG. 1.

The summation signal Vs and the difference signal Vd can be received by a digital processor device 23 and, for example, be digitized. The processor device can have a microcontroller μC for this purpose. For example, a root mean square value or RMS value can be calculated in each case for different times from the signals Vs, Vd by the processor device 23. The root mean square value function is denoted in the following text as rms( ). Furthermore, the processor device 23 can carry out monitoring, as illustrated in FIG. 6, and calibration, as illustrated in FIG. 5.

The monitoring apparatus 16 can have a leakage impedance measuring circuit M as a result. The terminal connections of the "floating" AC voltage source $U_{SG}$ are monitored using capacitive voltage dividers 17, 18 by virtue of the illustrated operational amplifiers of the voltage followers 20 of the measuring circuit M buffer-storing the component voltage signals $V_{meas\_1}$, $V_{meas\_2}$ of the voltage dividers 17, 18. The subtraction unit 22 forms the difference voltage or difference Vd; the summing unit 21 forms the summation voltage or sum Vs.

The signals Vd, Vs can subsequently be evaluated in analog fashion, for example using an RMS detector and comparators, or, as illustrated, in digital fashion.

The monitoring apparatus 16 can be designed, for example, for detection of a leakage impedance $Z_{leak}$ with parameter variations for the leakage impedance components $R_{leak}$ (200 kOhm to 4 MOhm) and $C_{leak}$ (10 pF to 200 pF).

Figure 2:
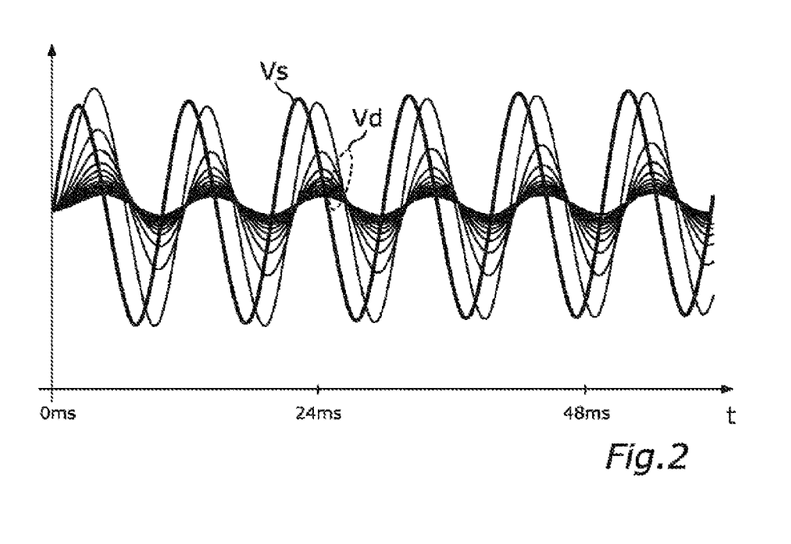
FIG. 2 shows a graph having time profiles of a summation signal and of a difference signal.

FIG. 2 shows signal profiles of the summation voltage Vs and of the difference voltage Vd for different values of $R_{leak}$. The summation voltage Vs is directly proportional to the floating AC voltage $U_{SG}$ and therefore makes it possible to measure $U_{SG}$ precisely by means of the voltage dividers 17, 18. The difference voltage Vd is approximately proportional to the leakage impedance $Z_{leak}$ and therefore makes it possible to measure the leakage resistance $R_{leak}$ precisely, for example by forming the RMS value rms(Vd) as delta root mean square value signal.

Figure 3:
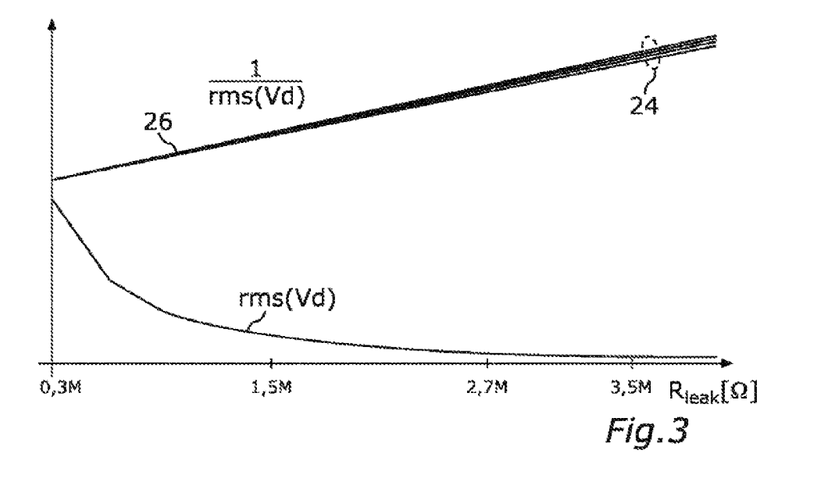
FIG. 3 shows a graph having signal values of a delta root mean square value signal and characteristic values formed therefrom.

FIG. 3 shows the RMS values, that is to say the delta root mean square value signal rms(Vd), of the difference voltage Vd as a function of the leakage resistance $R_{leak}$ in the case of a varying leakage capacitance $C_{leak}$ and the virtually linear course of a leakage current indicator 26, defined as the reciprocal of the RMS value of the measured leakage voltage, that is to say 1/rms(Vd). As FIG. 3 shows, the variation 24 of the leakage capacitance $C_{leak}$ does not have a significant influence.

By multiplying the leakage current indicator 1/rms(Vd) by a calibration value, it is possible to identify the present value of the leakage impedance $Z_{leak}$ with a predeterminable accuracy for a predetermined interval of values of the leakage resistance $R_{leak}$ and the leakage capacitance $C_{leak}$. $Z_{leak}$ can then be compared with a threshold value Z0 and, when the threshold value Z0 is exceeded, a fault signal 25 can be generated (see FIG. 1).

To this end, in the following text, the principle functioning of the monitoring apparatus 16 is explained with reference to FIG. 4.

By using two capacitive voltage dividers 17, 18, two AC measurement voltages, that is to say the component voltage signals $V_{meas\_1}$ and $V_{meas\_2}$, can be formed.

Figure 4:
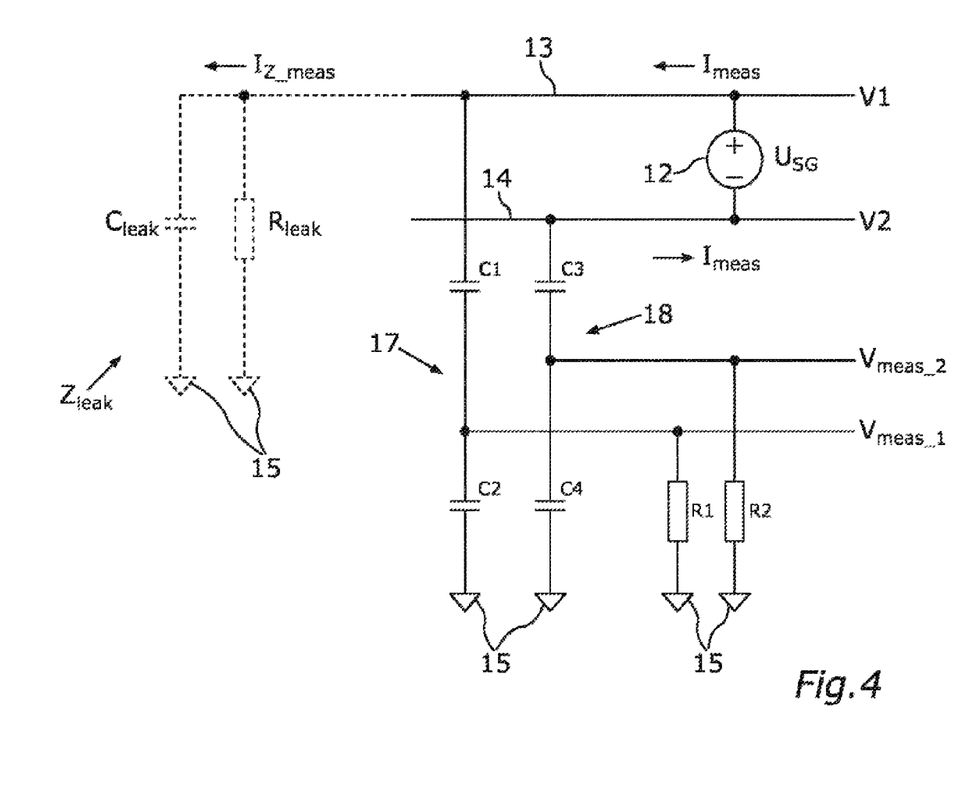
FIG. 4 shows a basic sketch for explaining the functioning of the apparatus of FIG. 1.

It can be shown that, using the circuit from FIG. 4, the RMS value rms(Vd) of the vector difference Vd=V_meas_2−V_meas_1 supplies information about the leakage impedance and the vector sum Vs=V_meas_2+ V_meas_1 is directly proportional to $U_{SG}$.

It is therefore possible
to recognize a possibly present leakage current,
to measure the leakage impedance $Z_{leak}$ precisely and
to measure the amplitude of the floating AC voltage $U_{SG}$, while the measuring circuit of the monitoring apparatus 16 always remains DC-isolated (through the use of the capacitors C1-C4).

On the basis of the measuring circuit of FIG. 4, the following analytical observation can be made and the described methods for measuring the isolation impedance and leakage impedance $Z_{leak}$ can be derived.

The impedances of the capacitors can be calculated as $$Z_C(C, f) = \frac{1}{2 \cdot \pi \cdot f \cdot j \cdot C} \quad \text{Eq. 1}$$

wherein the symbol · represents multiplication. For the further calculations, an auxiliary function is required, which defines the impedance of the RC parallel circuits $$Z_{rc}(C,R,f) = Z_p(Z_C(C,f),R) \quad \text{Eq. 2}$$

The current $I_{meas}$ flowing to the proposed measuring circuit and illustrated in FIG. 4 is therefore equal to $$I_{meas} = \frac{U_{SG}}{Z_p[Z_{leak}(R_1, C_1), (Z_C(C_1, f) + Z_{rc}(C_2, R_1, f))] + Z_{rc}(C_4, R_2, f) + Z_C(C_3, f)} \quad \text{Eq. 3}$$

The individual voltages at the DC-isolated AC voltage source 12 are calculated as $$V_2 = I_{meas} \cdot (Z_{rc}(C4,R2,f)) + Z_C(C3,f) \quad \text{Eq. 4}$$

$$V_1 := U_{AC} - V_2 \quad \text{Eq. 5}$$

The leakage current through the (possibly present) leakage impedance $Z_{leak}$ is therefore $$I_{Z_{leak}} \approx \frac{V_1}{Z_{leak}(R_{leak}, C_{leak})} \quad \text{Eq. 6}$$

Assuming some exemplary values for certain component parts, the proposed circuit can be analyzed in a practical manner. The following table indicates these exemplary values for the components of the proposed circuit in FIG. 4:

| Voltage source | $U_{SG}$ = 100 V | f ≈ 100 Hz | | |
|---|---|---|---|---|
| Capacitors | C1 ≈ 4.7 nF | C2 ≈ 220 nF | C3 ≈ C1 | C4 C2 |
| Tolerances of the capacitors | $TOL_{C1}$ ≈ 2% | $TOL_{C2}$ ≈ 10% | $TOL_{C3}$ ≈ TOL_C1 | $TOL_{C4}$ ≈ TOL_C2 |
| Resistors | R1 ≈ 110 kΩ | R2 ≈ R1 | | |
| Tolerances of the resistors | $TOL_{R1}$ ≈ 2% | $TOL_{R2}$ ≈ TOL_R1 | | |
| Test parameters $R_{leak}$, $C_{leak}$ | $R_{leak}$ ≈ 300 kΩ | $C_{leak}$ ≈ 0.05 nF | | |

With the aid of the above exemplary values, it is possible to calculate the leakage current as a function of $Z_{leak}$. The result is the leakage current indicator 26 of FIG. 3. In this case, in the variation 24, the leakage capacitance $C_{leak}$ of 5 pF to 500 pF (with nominally 50 pF) has been varied in order to also investigate the influence thereof. The virtually linear characteristic curves of the leakage current indicator 26 of FIG. 3 represents a leakage impedance estimation.

The output voltages of the measuring circuit can be derived as follows $$V_{meas\_2} := V_2 - I_{meas} \cdot Z_C(C3,f) \quad \text{Eq. 7}$$

$$V_{meas\_2} := I_{meas} \cdot Z_{rc}(C4,R,f) \quad \text{Eq. 8}$$

Furthermore, the current through C1 results from:

$$I_{C1} := I_{meas} \cdot I_{Z\_leak} \quad \text{Eq. 9}$$

$$V_{meas\_1} := V_1 - I_{C1} \cdot Z_C(C1,f) \quad \text{Eq. 10}$$

The equations for the leakage current indicator and the amplitude of the isolated voltage source $U_{SG}$ can therefore be defined:

$$V_{\Delta_{meas}}(U_{SG}, R_{leak}, C_{leak}, f) := V_{meas_2} - V_{meas\_1} \quad \text{Eq. 11}$$

$$V_{\Sigma\_meas}(U_{SG}, R_{leak}, C_{leak}, f) := V_{meas_2} + V_{meas_1} \quad \text{Eq. 12}$$

This produces the summation voltage Vs and the difference voltages Vd of eq. 11 and eq. 12 illustrated in the graph of FIG. 2. The summation voltage Vs=$V_{\Sigma\_meas}$ is directly proportional to the amplitude of the floating AC voltage $U_{SG}$. The difference voltage Vs=$V_{\Delta\_meas}$ in the case of different leakage resistances $R_{leak}$ produces information about the leakage impedance $Z_{leak}$.

It can be assumed and proven that the difference voltage Vd=$V_{\Delta\_meas}$ formed in this way is in wide ranges virtually inversely proportional to the leakage impedance:

$$Z_{leak} = K(Z_{leak}) \cdot \frac{1}{V_{\Delta\_meas}} \quad \text{Eq. 13}$$

wherein K is a proportionality factor. The still present non-linearity in the case of low values of the leakage impedance is depicted by a variable coefficient K($Z_{leak}$).

It is now possible to define a transfer function, which represents the ratio (analogously an amplification or a gain) between the actual leakage impedance $Z_{leak}$ and the measured leakage impedance indicator:

$$\text{Gain} \approx \frac{1}{|V_{\Delta\_meas}| \cdot Z\_\text{leak}} \cdot K(Z_{leak}) \qquad \text{Eq. 14}$$

A calibration method, as is explained below in connection with FIG. 5, can be applied to identify a matching K($Z_{leak}$) in practice so that the aforementioned transfer function becomes approximately equal to one through the suitable selection of K($Z_{leak}$) in the range of interest. The measurement error of $Z_{leak}$ in the relevant measurement range (for example $R_{leak}$ of 180 kOhm to 220 kOhm) is therefore minimized.

The purpose of the calibration is therefore to find, according to equation 14, a scaling factor or gain factor K($Z_{cal}$), which, in the relevant measurement range of $Z_{cal}$, determines a gain factor of equal to one (gain=1):

$$K(Z_{cal}) = 1 \cdot |V_{\Delta\_Meas\_cal}| \cdot Z_{cal} \qquad \text{Eq. 15}$$

FIG. 5 illustrates a flowchart for calibration 27.

In a calibration step K1, the calibration can be triggered, for example, by a calibration signal (START CAL). In a calibration step K2, it is possible to check whether a direct current DC is flowing between the AC voltage lines 13, 14 on the one hand and the reference potential 15 on the other hand. If this is the case (symbolized in FIG. 5 by +), in a calibration step K3, the calibration 27 can be terminated, since it is recognized that the apparatus 10 is not in order (NOK—not OK), that is to say does not have DC-decoupled AC voltage lines 13, 14 as intended.

In the case of a lack of direct current DC (symbolized in FIG. 5 by −), in a calibration step K4, a first root mean square value Vs1 of a summation root mean square value signal rms(Vs) of the summation signal Vs can be generated.

In a calibration step K5, a leakage impedance as a calibration impedance having a known calibrated impedance value $Z_{cal}$ can be connected in a targeted manner between the AC voltage lines 13, 14 on the one hand and the reference potential 15 on the other hand. The impedance value $Z_{cal}$ is preferably located in an interval of impedance values, which represent those in the relevant measurement range. In particular, the impedance value corresponds to said threshold value Z0.

In the case of an interconnected calibration impedance, in a calibration step K6, a second root mean square value Vs2=rms(Vs) of the summation signal Vs can be generated. The root mean square values Vs1, Vs2 can be formed as single measurements or respectively, for example, as an average value from a plurality of measurements.

In a calibration step K7, a root mean square value rms(Vd) of the difference signal Vd can be identified.

If it is recognized in a calibration step K8 that the root mean square values Vs1 and Vs2 are not equal (symbolized in FIG. 5 by −), the calibration 27 can be terminated in accordance with calibration step K3. In this case, it is recognized that the AC voltage source 12 generates the AC voltage $U_{SG}$ with a floating root mean square value.

If the root mean square values Vs1, Vs2 are equal or at least the magnitude of their difference is lower than a predetermined maximum value (symbolized in FIG. 5 by +), the gain factor K($Z_{cal}$) can be calculated in accordance with equation eq. 15 in a calibration step K9.

After calibration has taken place, the actual measurement process can be carried out by the monitoring apparatus 16 periodically or continuously according to the monitoring 28 illustrated in FIG. 6.

The monitoring apparatus 16 can be started, for example, by a start signal START in a monitoring step O1. In a monitoring step O2, the gain factor K($Z_{cal}$) can be provided, for example it can be loaded from a data store. In a monitoring step O3, a present signal value of the difference signal Vd can be identified. In a monitoring step O4, a present signal value of the root mean square value signal rms(Vd) can be identified. In a monitoring step O5, an impedance value of the leakage impedance $Z_{leak}$ can be calculated or estimated on the basis of the gain factor K($Z_{cal}$) as $$Z_{leak} = K(Z_{cal})/\text{rms}(Vd).$$

In a monitoring step O6, it is possible to check whether the estimated leakage impedance is lower than the threshold value Z0. In this case, Z0 represents a triggering criterion. The comparison can be carried out, for example, as a comparison of the magnitudes of the impedances. If the estimated leakage impedance is lower than the threshold value (symbolized in FIG. 6 by +), the fault signal 25 can be generated in a monitoring step O7. The AC voltage source 12 can then be switched off depending on the fault signal 25, for example.

If the estimated leakage impedance is not lower than the threshold value (symbolized in FIG. 6 by −), the monitoring 28 can be resumed with monitoring step O3.

When dimensioning the measuring circuit of FIG. 1 and FIG. 3, and when implementing the monitoring 28, whether it be analog or digital, it should be taken into account that the leakage current indicator 26 is dependent on frequency due to the reactance of the capacitors C1-C4 in the voltage dividers 17, 18. If the AC voltage source 12 that is to be monitored should be operated at different frequencies, this must be taken into account.

A tolerance analysis (not illustrated in more detail here) shows that a worst-case tolerance of the leakage indicator of lower than 4 percent is produced at a leakage resistance $R_{leak}$=200 kOhm using the circuit of FIG. 1 and FIG. 3. An average tolerance of the leakage indicator is 2.6 percent given $R_{leak}$=200 kOhm.

Overall, the apparatus 10 has, in particular, the following advantages:
- DC-isolated, separate measuring circuit (owing to the use of capacitors),
- cost-effective solution, managed without an expensive isolation amplifier,
- high-resolution, sensitive owing to the introduction of a linear, steep leakage current indicator function,
- precise measurement of the leakage impedance after calibration,
- the reactive component of the leakage impedance (the capacitance $C_{leak}$) can also be detected,
- the amplitude of the AC voltage $U_{SG}$ is also measured,
- the signals can be evaluated in analog or digital fashion,
- DC-neutral circuit, a standard isolation test (which is carried out using DC voltage), for example in the production and manufacturing or else during maintenance, is therefore easily possible, without the appliance having to be activated.

Overall, the example therefore shows how the invention can provide a method and a circuit for identifying the leakage impedance of an isolated AC voltage source.

LIST OF REFERENCE NUMERALS

10 Apparatus
11 Smart-glass panel
12 AC voltage source
13 AC voltage line
14 AC voltage line
15 Reference potential
16 Monitoring apparatus
17 Voltage divider
18 Voltage divider
19 Supply voltage source
20 Voltage follower
21 Summing unit
22 Subtraction unit
23 Processor device
24 Variation
25 Fault signal
26 Leakage current indicator
27 Calibration
28 Monitoring

The invention claimed is:

1. A method for monitoring an AC voltage source, which is DC-decoupled from a reference potential and which generates an AC voltage between two AC voltage lines, the method comprising:
during operation of the AC voltage source, continuously coupling each of the AC voltage lines to the reference potential by way of a respective capacitive voltage divider such that the AC voltage source causes a respective current to flow between the AC voltage source and the reference potential on each of the AC voltage lines;
tapping a respective component voltage signal at the voltage dividers;
generating at least one root mean square value signal from the respective component voltage signal at the voltage dividers;
carrying out a check to determine whether the respective root mean square value signal meets a predetermined triggering criterion; and
when the triggering criterion is met, generating a fault signal and switching off the AC voltage source in response to the fault signal.

2. The method according to claim 1, which comprises generating a summation root mean square value signal from a sum of the component voltage signals.

3. The method according to claim 2, wherein, as triggering criterion, a check is carried out to determine whether a signal value of the summation root mean square value signal is located outside of a predetermined value interval, which describes predetermined rated voltage values of the AC voltage.

4. The method according to claim 1, which comprises generating a delta root mean square value signal from a difference of the component voltage signals.

5. The method according to claim 4, wherein, as triggering criterion, a check is carried out to determine whether a signal value of the delta root mean square value signal is located in a predetermined value interval.

6. The method according to claim 4, which comprises scaling a signal value of the delta root mean square value signal using a gain factor and, as a result, identifying an impedance value of a leakage impedance that is effective between the AC voltage lines and the reference potential.

7. The method according to claim 6, wherein, as triggering criterion, a check is carried out to determine whether the impedance value is lower than a predetermined triggering value.

8. The method according to claim 6, which comprises:
identifying a gain factor K by way of a calibration and the calibration comprises;
while a predetermined calibration impedance couples the AC voltage lines to the reference potential, identifying a signal value rms of the delta root mean square value signal and, on the basis of the signal value rms and an impedance value Zcal of the calibration impedance calculating the gain factor K as $K(Zcal)=Zcal*rms(Vd)$.

9. The method according to claim 8, wherein the calibration includes a DC test by checking, before and/or after determining the signal value of the delta root mean square value signal, whether or not a direct current is flowing between at least one of the AC voltage lines and the reference potential, and, if a direct current is flowing, terminating the calibration.

10. The method according to claim 8, wherein the calibration comprises, before and after determining the signal value of the delta root mean square value signal, identifying a root mean square voltage value of the AC voltage of the AC voltage source in each case, and terminating the calibration if a difference between the root mean square voltage values is greater than a predetermined tolerance value.

11. A monitoring apparatus for monitoring an AC voltage source, which is DC-decoupled from a reference potential and which generates an AC voltage between two AC voltage lines, the monitoring apparatus comprising:
a respective capacitive voltage divider for each of the two AC voltage lines, said respective capacitive voltage dividers continuously capacitively coupling the AC voltage lines to the reference potential during operation of the AC voltage source; and
a measuring circuit (M) for detecting component voltage signals at said voltage dividers, said monitoring apparatus being configured to carry out the method according to claim 1.

12. An apparatus, comprising:
an AC voltage source, which is DC-decoupled from a reference potential and which is configured to generate an AC voltage between two AC voltage lines; and
a monitoring apparatus coupled to the two AC voltage lines and to the reference potential, said monitoring apparatus including:
a respective capacitive voltage divider for each of the two AC voltage lines, said respective capacitive voltage dividers continuously capacitively coupling the AC voltage lines to the reference potential during operation of the AC voltage source; and
a measuring circuit (M) for detecting component voltage signals at said voltage dividers, said monitoring apparatus being configured to carry out the method according to claim 1.

13. The apparatus according to claim 12, configured as a smart-glass window arrangement or as a high-voltage on-board power supply system of a motor vehicle or as a hybrid drive of a motor vehicle or as a medical appliance.

* * * * *